(12) United States Patent
Kim et al.

(10) Patent No.: US 12,412,840 B2
(45) Date of Patent: Sep. 9, 2025

(54) POWER MODULE WITH MULTI-LAYER SUBSTRATE AND SECOND INSULATION LAYER TO INCREASE POWER DENSITY

(71) Applicant: Texas Instruments Incorporated, Dallas, TX (US)

(72) Inventors: Kwnag-Soo Kim, Sunnyvale, CA (US); Vivek Kishorechand Arora, San Jose, CA (US); Woochan Kim, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 491 days.

(21) Appl. No.: 17/830,291

(22) Filed: Jun. 1, 2022

(65) Prior Publication Data

US 2023/0395514 A1    Dec. 7, 2023

(51) Int. Cl.

| | |
|---|---|
| *H01L 23/538* | (2006.01) |
| *H01L 21/48* | (2006.01) |
| *H01L 23/373* | (2006.01) |
| *H01L 23/00* | (2006.01) |
| *H01L 23/31* | (2006.01) |
| *H01L 23/498* | (2006.01) |
| *H01L 25/16* | (2023.01) |
| *H01L 25/18* | (2023.01) |

(52) U.S. Cl.
CPC ........ *H01L 23/5383* (2013.01); *H01L 21/481* (2013.01); *H01L 21/4857* (2013.01); *H01L 23/3735* (2013.01); *H01L 23/3121* (2013.01); *H01L 23/49894* (2013.01); *H01L 24/48* (2013.01); *H01L 25/16* (2013.01); *H01L 25/18* (2013.01); *H01L 2224/48225* (2013.01)

(58) Field of Classification Search
CPC .......................... H01L 21/481; H01L 21/4857; H01L 25/16; H01L 25/18
See application file for complete search history.

(56) References Cited

U.S. PATENT DOCUMENTS

| | | | | |
|---|---|---|---|---|
| 2010/0127371 A1* | 5/2010 | Tschirbs | ................ | H05K 1/142 |
| | | | | 257/E23.083 |
| 2011/0115068 A1* | 5/2011 | Hartung | ................. | H01L 24/48 |
| | | | | 257/690 |
| 2013/0134572 A1* | 5/2013 | Lenniger | ............... | H01L 23/367 |
| | | | | 438/122 |

(Continued)

*Primary Examiner* — Eugene Lee
(74) *Attorney, Agent, or Firm* — Xiaotun Qiu; Frank D. Cimino (57) ABSTRACT

An example semiconductor package comprises a multi-layer substrate having a bottom metal layer, a top metal layer, and a first insulation layer between bottom metal layer and the top metal layer. A plurality of first conductive traces are formed in the top metal layer. A second insulation layer is disposed over the exposed portions of the first insulation layer and over segments of the first conductive traces. A plurality of second conductive traces formed on top of the second insulation layer. One or more semiconductor dies are mounted on the one or more second segments of the conductive traces. One or more bond wires couple the semiconductor dies to one or more of the second conductive traces. A mold compound covers at least a portion of the semiconductor dies, the second insulation layer, the first conductive traces, and the second conductive traces.

14 Claims, 5 Drawing Sheets

(56) References Cited

U.S. PATENT DOCUMENTS

| | | | |
|---|---|---|---|
| 2013/0140684 A1* | 6/2013 | Hauenstein | H01L 23/552 |
| | | | 257/659 |
| 2021/0257275 A1* | 8/2021 | Park | H01L 25/18 |
| 2021/0296217 A1* | 9/2021 | Tang | H01L 23/49575 |
| 2022/0070996 A1* | 3/2022 | Esler | H05K 7/20509 |
| 2022/0093492 A1* | 3/2022 | Elsherbini | H01L 23/5386 |
| 2022/0173013 A1* | 6/2022 | Matsuzawa | H01L 23/473 |
| 2022/0399294 A1* | 12/2022 | Dogiamis | H01L 23/5383 |

* cited by examiner

POWER MODULE WITH MULTI-LAYER SUBSTRATE AND SECOND INSULATION LAYER TO INCREASE POWER DENSITY

BACKGROUND

Conventional Intelligent Power Modules (IPM) often use a Direct Bonded Copper (DBC) substrate or an Insulated Metal Substrate (IMS) substrate for mounting power transistors, such as power Metal-Oxide-Semiconductor Field-Effect Transistors (MOSFET) or Insulated-Gate Bipolar Transistors (IGBT). IPMs provide an integrated, compact power module that can be used to drive motors, for example. The DBC substrate provides good isolation by virtue of a ceramic layer and good thermal performance owing to the thermal conductivity of the ceramic layer. But, in the DBC substrate, only a single layer of copper can be utilized for power modules due to limitations of the fabrication process. The IMS substrate also provides good isolation and good thermal performance. The IMS substrate provides good design flexibility with a relatively thin top copper layer, which allows for more complicated pattern designs and fine patterns compared to the DBC substrate. However, the IMS substrate is limited because only a single layer copper is utilized.

SUMMARY

In an arrangement, a semiconductor package comprises a multi-layer substrate having a bottom metal layer, a top metal layer, and a first insulation layer between bottom metal layer and the top metal layer. A plurality of first conductive traces are formed in the top metal layer. At least a portion of the first insulation layer is exposed between the first conductive traces. A second insulation layer is disposed over the exposed portions of the first insulation layer and over one or more first segments of the first conductive traces. One or more second segments of the conductive traces are not covered by the second insulation layer. A plurality of second conductive traces formed on top of the second insulation layer. One or more semiconductor dies are mounted on the one or more second segments of the conductive traces. One or more bond wires couple the semiconductor dies to one or more of the second conductive traces. A mold compound covers at least a portion of the semiconductor dies, the second insulation layer, the first conductive traces, and the second conductive traces.

The first conductive traces form a first circuit pattern, and the second conductive traces form a second circuit pattern. The second insulation layer isolates the first conductive traces from the second conductive traces.

One or more passive devices may be coupled to one or more of the second conductive traces.

The multi-layer substrate may be a Direct Bonded Copper (DBC) substrate in one arrangement. The first insulation layer is a ceramic layer in the DBC substrate.

The multi-layer substrate may be an Insulated Metal Substrate (IMS) in another arrangement. The first insulation layer includes an epoxy and a ceramic filler in the IMS substrate.

The second insulation layer may be a Thermally Conductive electrically Isolated Layer (TCIL). The semiconductor package of claim 1, wherein the second insulation layer includes an epoxy and a ceramic filler. The ceramic filler may include one or more of Aluminum Oxide ($Al_2O_3$), Aluminum Nitride (AlN), Silicon Nitride ($Si_3N_4$), or Boron Nitride (BN). The second insulation layer may be a B-stage insulation layer or have an adhesion layer.

In another example, a method for manufacturing a semiconductor package, comprises providing a multi-layer substrate having a bottom metal layer, a top metal layer, and a first insulation layer between bottom metal layer and the top metal layer; forming a plurality of first conductive traces in the top metal layer, and wherein at least a portion of the first insulation layer is exposed between the first conductive traces; providing a second insulation layer, wherein the second insulation is patterned based upon a layout of the first conductive traces; forming a plurality of second conductive traces on top of the second insulation layer; placing the second insulation layer over the multi-layer substrate to cover the exposed portions of the first insulation layer and to cover one or more first segments of the conductive traces, wherein one or more second segments of the conductive traces are not covered by the second insulation layer; mounting one or more semiconductor dies on the one or more second segments of the conductive traces; and covering one or more of the semiconductor dies, the second insulation layer, the first conductive traces, and the second conductive traces with a mold compound. The method further comprises adhering the second insulation layer to the multi-layer substrate using heat and pressure. The adhering may include curing at approximately 160 to 180° C. with <10 kgf/cm2 pressure.

BRIEF DESCRIPTION OF THE DRAWINGS

Having thus described the invention in general terms, reference will now be made to the accompanying drawings, wherein:

DETAILED DESCRIPTION

The present disclosure is described with reference to the attached figures. The figures are not drawn to scale, and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Corresponding numerals and symbols in the different figures generally refer to corresponding parts, unless otherwise indicated. The figures are not necessarily drawn to scale. In the drawings, like reference numerals refer to like elements throughout, and the various features are not necessarily drawn to scale. In the following discussion and in the claims, the terms "including," "includes," "having," "has," "with," or variants thereof are intended to be inclusive in a manner similar to the term "comprising," and thus should be interpreted to mean "including, but not limited to . . . " Also, the terms "coupled," "couple," and/or or "couples" is/are intended to include indirect or direct electrical or mechanical connection or combinations thereof. For example, if a first device couples to or is electrically coupled with a second device that connection may be through a direct electrical connection, or through an indirect electrical connection via one or more intervening devices and/or connections. Elements that are electrically connected with intervening wires or other conductors are considered to be coupled. Terms such as "top," "bottom," "front," "back," "over," "above," "under," "below," and such, may be used in this disclosure. These terms should not be construed as limiting the position or orientation of a structure or element but should be used to provide spatial relationship between structures or elements.

The term "semiconductor die" is used herein. A semiconductor device can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device may also be referred to herein as a semiconductor device or an integrated circuit (IC) die.

The term "semiconductor package" is used herein. A semiconductor package has at least one semiconductor die electrically coupled to terminals and has a package body that protects and covers the semiconductor die. In some arrangements, multiple semiconductor dies can be packaged together. For example, a power metal oxide semiconductor (MOS) field effect transistor (FET) semiconductor device and a second semiconductor device (such as a gate driver die, or a controller die) can be packaged together to from a single packaged electronic device. Additional components such as passive components, such as capacitors, resistors, and inductors or coils, can be included in the packaged electronic device. The semiconductor die is mounted with a package substrate that provides conductive leads. A portion of the conductive leads form the terminals for the packaged device. In wire bonded integrated circuit packages, bond wires couple conductive leads of a package substrate to bond pads on the semiconductor die. The semiconductor die can be mounted to the package substrate with a device side surface facing away from the substrate and a backside surface facing and mounted to a die pad of the package substrate. The semiconductor package can have a package body formed by a thermoset epoxy resin mold compound in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions form the terminals for the semiconductor package. The semiconductor package may also be referred to as a "integrated circuit package," a "microelectronic device package," or a "semiconductor device package."

The term "substrate" is used herein. A package substrate is a substrate arranged to receive a semiconductor die and to support the semiconductor die in a completed semiconductor device package. Package substrates useful with the arrangements include conductive lead frames, which can be formed from copper, aluminum, stainless steel, steel, and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. In example arrangements, a heat slug is attached to the package substrate, and the heat slug has a die mounting area for mounting semiconductor devices. The lead frames can be provided in strips or arrays. The conductive lead frames can be provided as a panel with strips or arrays of unit device portions in rows and columns. Semiconductor dies can be placed on respective unit device portions within the strips or arrays. A semiconductor die can be placed on a die mount area for each packaged semiconductor die. Die attach or die adhesive can be used to mount the semiconductor dies. In wire bonded packages, bond wires can couple bond pads on the semiconductor dies to the leads of the lead frames. The lead frames may have plated portions in areas designated for wire bonding, for example silver, nickel, gold, or palladium plating can be used. After the bond wires are in place, a portion of the package substrate, the semiconductor die, and at least a portion of the die pad can be covered with a protective material such as a mold compound. More than one semiconductor die can be mounted to a package substrate for each unit.

In packaging microelectronic and semiconductor devices, a mold compound may be used to partially cover a package substrate, to cover components, to cover a semiconductor die, and to cover the electrical connections from the semiconductor die to the package substrate. This molding process can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed by pressing the liquid mold compound into a mold through runners or channels. Transfer molding can be used. Unit molds shaped to surround an individual device may be used, or block molding may be used, to form multiple packages simultaneously for several devices from mold compound. The devices to be molded can be provided in an array or matrix of several, hundreds or even thousands of devices in rows and columns that are then molded together.

After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

In example arrangements, a microelectronic device package includes a power module structure with multi-layers of power substrate based on IMS or DBC substrates. Stacked layers can be realize using multi-layers of patterned copper layers to provide complicated circuits and improve power density.

Figure 1:
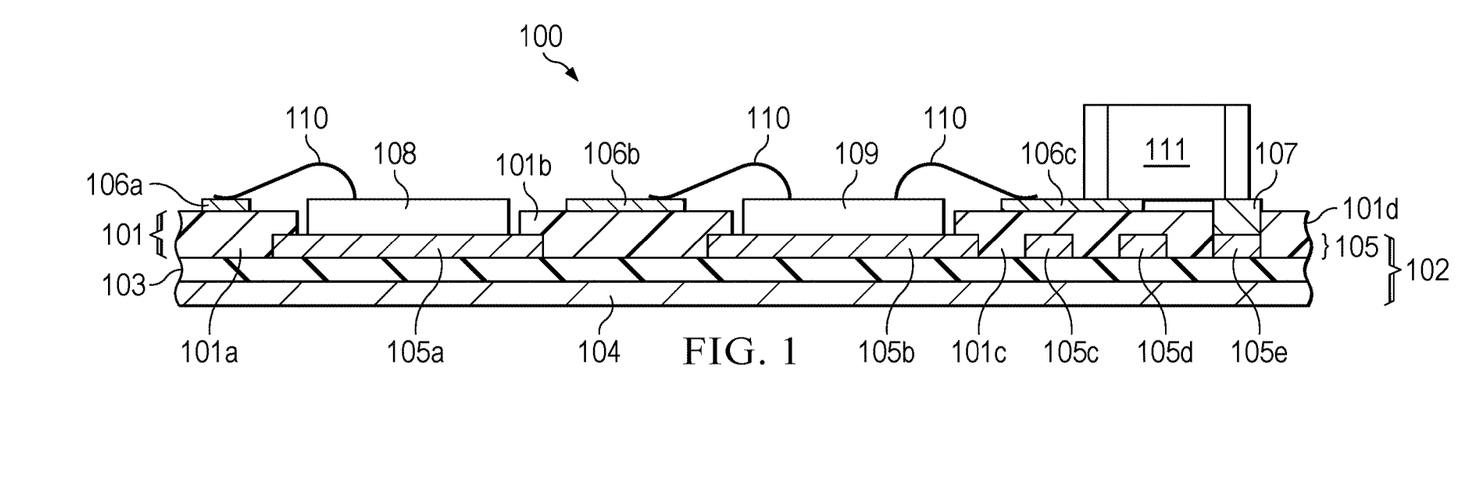
FIG. 1 is a cross section view of a power module structure having a pre-patterned TCIL overlaid on a DBC substrate.

FIG. 1 is a cross section view of a power module structure 100 having a pre-patterned Thermally Conductive electrically Isolated Layer (TCIL) 101 overlaid on a DBC substrate 102. The DBC substrate 102 includes a ceramic dielectric layer 103, such as Aluminum Oxide ($Al_2O_3$), Aluminum Nitride (AlN), or Silicon Nitride ($Si_3N_4$), a bottom metal layer 104, such as copper, and a top copper layer 105 that has been patterned into various conductive segments 105*a-e*. The ceramic core dielectric layer 103 has good thermal conductivity and provides electrical isolation between the high and low voltage areas of the power module structure 100. The various conductive segments 105*a-e* in the top copper layer 105 are approximately 300 um thick in one arrangement and form a circuit pattern on the active side of the DBC substrate 102.

TCIL 101 consists of epoxy with ceramic fillers, such as Aluminum Nitride (AlN), or Silicon Nitride ($Si_3N_4$), or Boron Nitride (BN). TCIL 101 is patterned into a various segments 101*a-d* that overlap exposed portions of ceramic dielectric layer 103 and the conductive segments 105*a-e* of DBC substrate 102. A number of conductive elements 106*a-c*, such as copper segments, are formed on top of TCIL 101. Additional conductive material 107, such as copper, may be dispensed within gaps between the TCIL segments 101*c*, 101*d* to provide a connection to a conductive segment 105*e*. TCIL 101 provides good thermal conductivity on the order of 10 W/mK and has good electrical isolation properties. Arrangements using TCIL 101 allow for multi-layer circuit patterns to be built up on top of DBC substrate 102. For example, a first circuit pattern comprising conductive segments 105*a-e* is isolated from a second circuit pattern comprising copper segments 106*a-c* by TCIL 101.

In some arrangements, conductive segments 105*a*, 105*b* may function as Die Attach Pads (DAP) for mounting semiconductor dies 108 and 109, respectively. Bond wires 110 may couple bond pads on semiconductor dies 108 and 109 to conductive elements 106*a-c*. Other active or passive components 111, such as capacitors, diodes, coils, resistors, and inductors, may be directly attached to conductive pads or conductive material, such as contact 106*c* or conductive material 107. The heat transfer path for the power module structure 100 is first through the top copper layer 105, then through the ceramic dielectric layer 103, and then finally out the bottom metal layer 104, which may function as a heatsink to the ambient.

Figure 2:
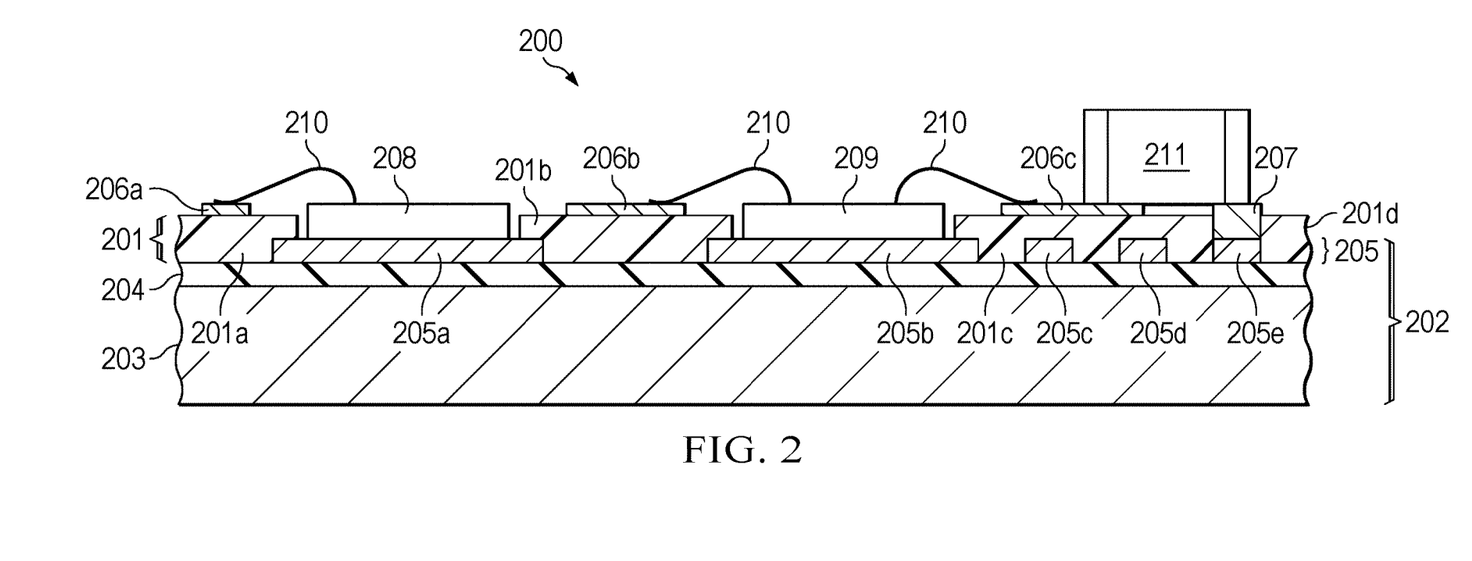
FIG. 2 is a cross section view of a power module structure having a pre-patterned TCIL layer overlaid on an IMS substrate.

FIG. 2 is a cross section view of a power module structure 200 having a pre-patterned TCIL layer 201 overlaid on an IMS substrate 202. The IMS substrate 202 includes a metal base plate 203 covered by a thin dielectric layer 204 and a top copper layer 205. The metal base plate 203 may be formed of aluminum or copper, for example. The dielectric layer 204 may be an epoxy layer with a filler such as Aluminum Oxide ($Al_2O_3$), Aluminum Nitride (AlN), Boron Nitride (BN) or a glass-reinforced epoxy laminate such as FR4. The epoxy-based dielectric layer 204 has a lower thermal conductivity as compared to the ceramics layer 103 as used in the DBC substrate 102 and is usually a thinner layer. Similarly, the top copper layer 205 is typically thinner in the IMS substrate 202 compared to top layer 105 in the DBC substrate 102 and is generally 35 um to 200 um thick. Top copper layer 205 is patterned into various conductive segments 205 *a-e*. The conductive segments 205 *a-e* form a circuit pattern on the active side of the IMS substrate 202.

TCIL 201 consists of epoxy with ceramic fillers, such as Aluminum Nitride (AlN), or Silicon Nitride ($Si_3N_4$), or Boron Nitride (BN). TCIL 201 is patterned into various segments 201 *a-d* that overlap exposed portions of the dielectric layer 204 and the conductive segments 205 *a-e* of the IMS substrate 202. A number of conductive elements 206 *a-c*, such as copper segments, are formed on top of TCIL 201. Additional conductive material 207, such as copper, may be dispensed within gaps between the TCIL segments 201 *c*, 201 *d* to provide a connection to a conductive segment 205 *e*. Arrangements using TCIL 201 allow for multi-layer circuit patterns to be built up on top of the IMS substrate 202. For example, a first circuit pattern comprising conductive segments 205 *a-e* is isolated from a second circuit pattern comprising copper segments 206 *a-c* by TCIL 201.

In some arrangements, conductive segments 205 *a*, 205 *b* may function as Die Attach Pads (DAP) for mounting semiconductor dies 208 and 209, respectively. Bond wires 210 may couple bond pads on semiconductor dies 208 and 209 to conductive elements 206 *a-c*. Other active or passive components 211, such as capacitors, diodes, coils, resistors, and inductors, may be directly attached to conductive pads or conductive material, such as contact 206 *c* or conductive material 207. The heat transfer path for the power module structure 200 is first through the top copper layer 205, then through the epoxy dielectric layer 204, and then finally out the bottom metal layer 203, which may function as a heatsink to the ambient.

Figure 3A:
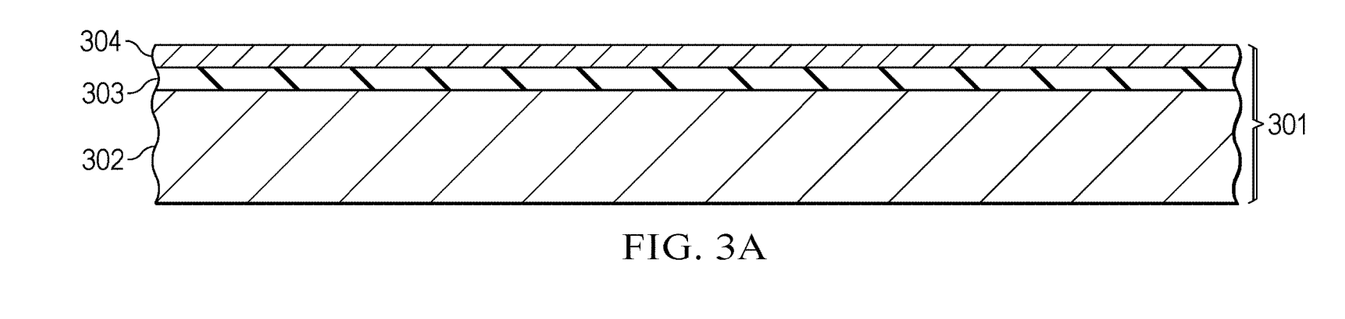
FIGS. 3A-F schematically illustrate an example fabrication and assembly process for a power module package in a series of cross section views.

FIGS. 3A-F schematically illustrate an example fabrication and assembly process for a power module package in a series of cross section views. In FIG. 3A, an IMS panel 301 is provided. IMS panel 301 includes a base metal layer 302, such aluminum or copper. An insulation layer 303 with a high thermal conductivity is formed on top of the base metal layer 302. The insulation layer may include an epoxy resin with fillers, such as Aluminum Oxide ($Al_2O_3$), Aluminum Nitride (AlN), in one arrangement. A thin conductive layer 304 is formed on top of the insulation layer 303. The conductive layer 304 may be copper, gold, silver, aluminum, or an alloy of these.

Figure 3B:
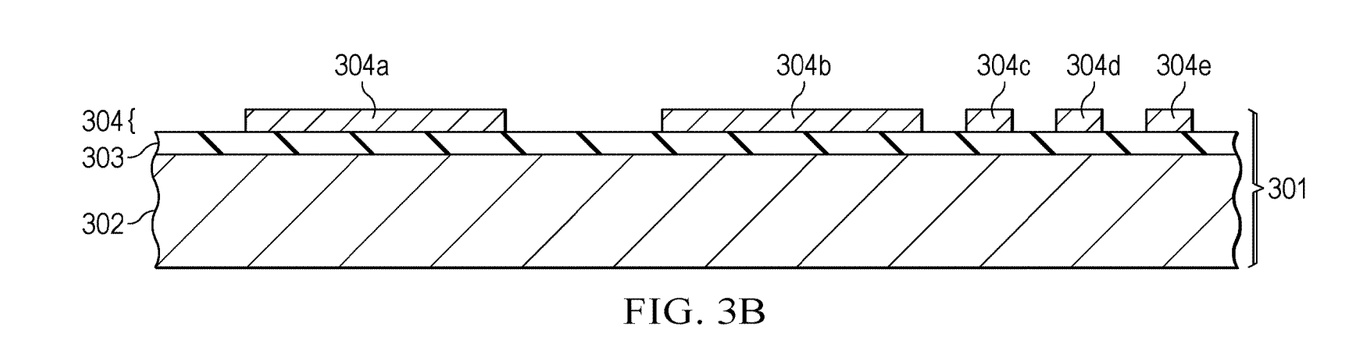

FIG. 3B illustrates the top conductive layer 304 of IMS panel 301 after it has been patterned into a number of conductive segments 304*a-e*. A photoresist material, such as a dry film resist (DFR), may be applied to the top layer 304. The photoresist material may then be irradiated, such as with a visible light laser, using a mask that forms the desired conductive segments 304*a-e*. IMS panel 301 is just a portion of a larger IMS sheet. Although not shown in the cross section view, it will be understood that conductive segments 304*a-e* and other conductive traces (not shown) form a first set of circuit patterns on the top surface of insulation layer 303.

Figure 3C:
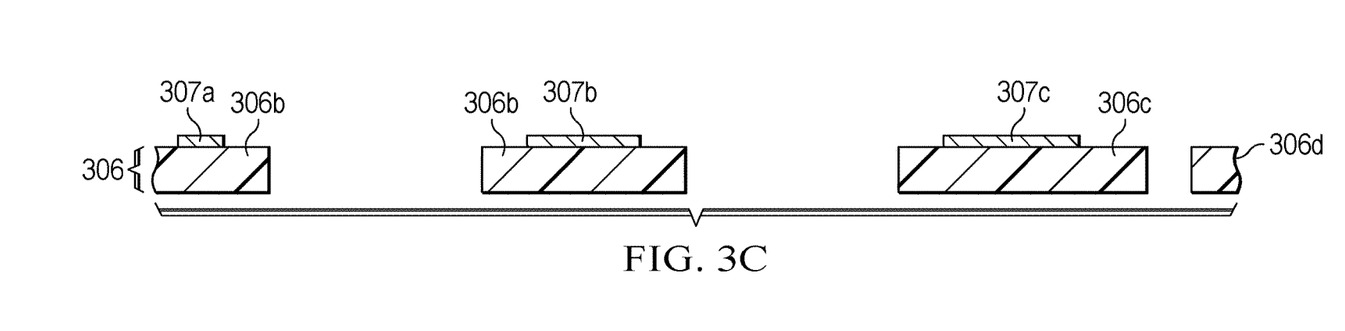

FIG. 3C illustrates a prepatterned TCIL layer 306. In one arrangement, the TCIL layer 306 may be a B-stage insulation layer, such as a resin layer is in a semi-cured state. The TCIL layer 306 may include an epoxy with ceramic fillers, such as Aluminum Oxide ($Al_2O_3$), Aluminum Nitride (AlN), Silicon Nitride ($Si_3N_4$), or Boron Nitride (BN). Metal contacts 307*a-c*, such as pads formed of copper, gold silver, aluminum, or an alloy of these, deposited on the top surface of the TCIL layer 306. Although not shown in the cross section view, it will be understood that metal contacts 307*a-c* and other conductive traces (not shown) form a second set of circuit patterns on the top surface of TCIL layer 306. The prepatterned TCIL layer 306 is part of a larger sheet and comprises a number of TCIL segments 306*a-d* that are adapted to interface with the top layer 304 of the IMS panel 301.

Figure 3D:
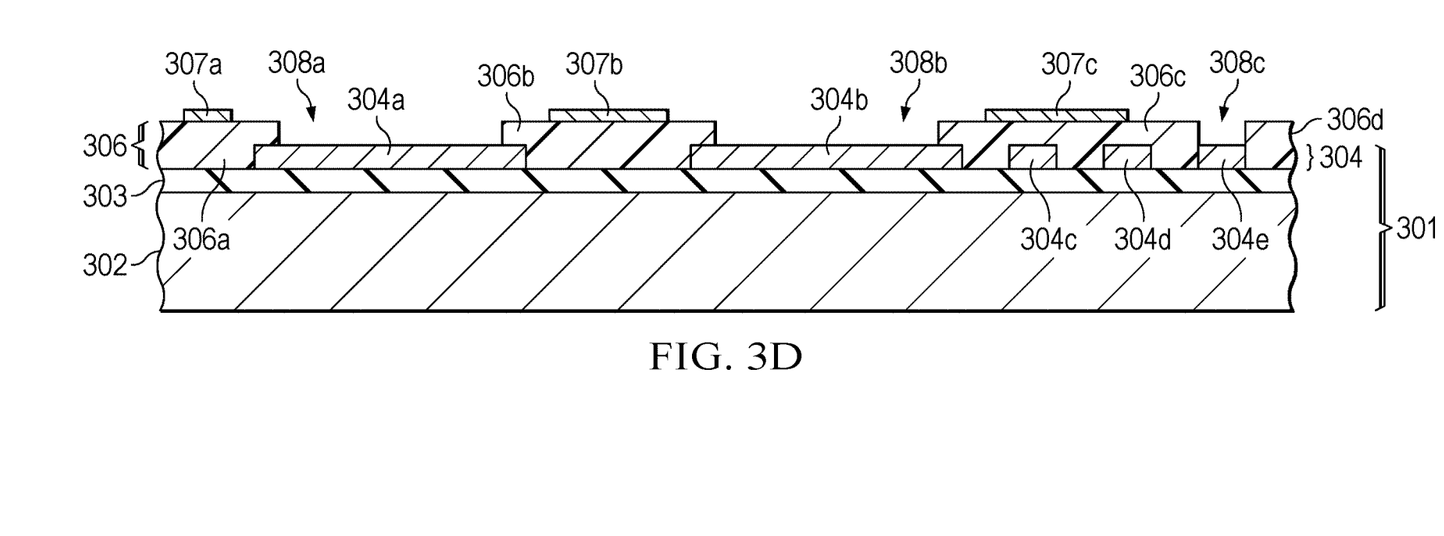

FIG. 3D illustrates the prepatterned TCIL layer segments 306*a-d* along with the copper pads 307*a-c* bonded onto the top of IMS panel 301. The TCIL sheet 306 is stacked on the IMS substrate 301 and then bonded to the top copper layer 304 and the insulation layer 303 using heat and pressure. In one arrangement, the adhesion process requires curing at approximately 160 to 180° C. with <10 kgf/cm² pressure. The TCIL layer 306 provides good electrical isolation between the copper pads 307a-c and conductive segments 304a-e. The TCIL layer 306 also provides good thermal conductivity of about 5 to 20 W/mK. The prepatterned TCIL layer 306 may leave gaps 308a-c between the segments 306a-d so that some conductive segments 304a-e are exposed after the TCIL layer 306 is attached to the IMS panel 301. For example, gaps 308a, 308b expose conductive segments 304a and 304b, which may be die attach pads, and gap 308c allows for access to conductive trace 304e. Other conductive segments, such as 304c and 304d are covered by TCIL layer 306 and isolated from other components.

Figure 3E:
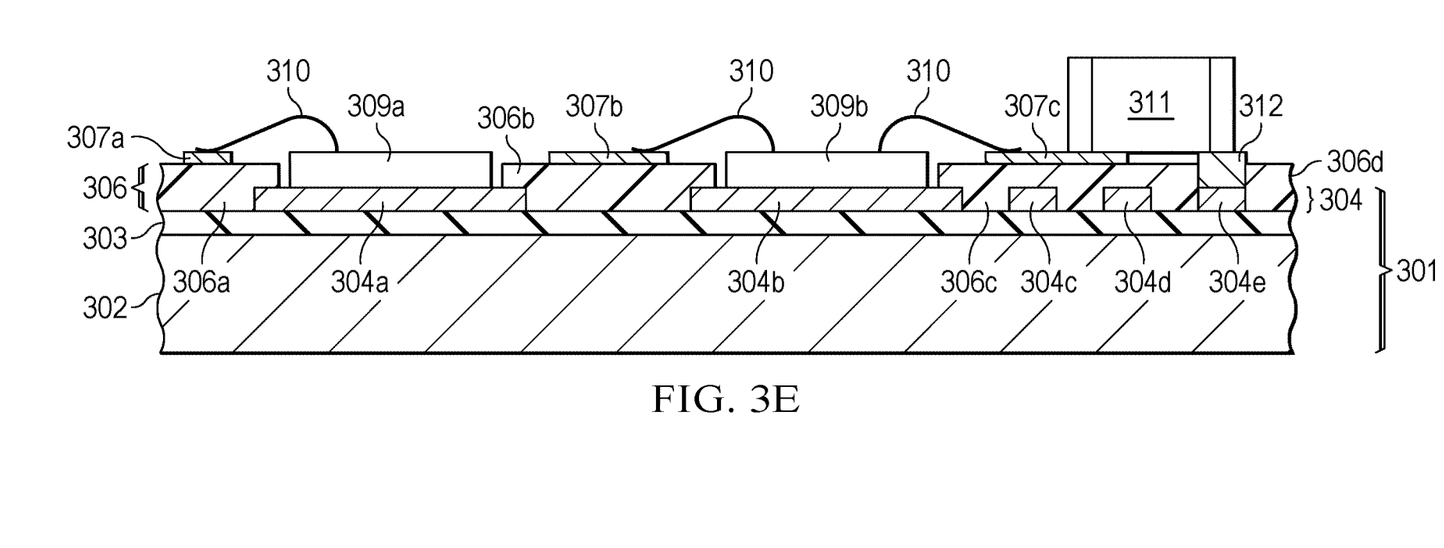

FIG. 3E illustrates semiconductor dies 309a, 309b attached to conductive segments 304a, 304b, respectively, and interconnected to copper pads 307a-c by bond wires 310. In one arrangement, semiconductor dies 309a, 309b may be MOSFET, FET, or other integrated circuit (IC) devices. A passive element 311 is attached to the device and coupled to copper pad 307c and conductive segment 304e. Additional conductive material 312 may be dispensed into gap 308c to provide an electrical connection between the passive element 311 and conductive segment 304e.

Figure 3F:
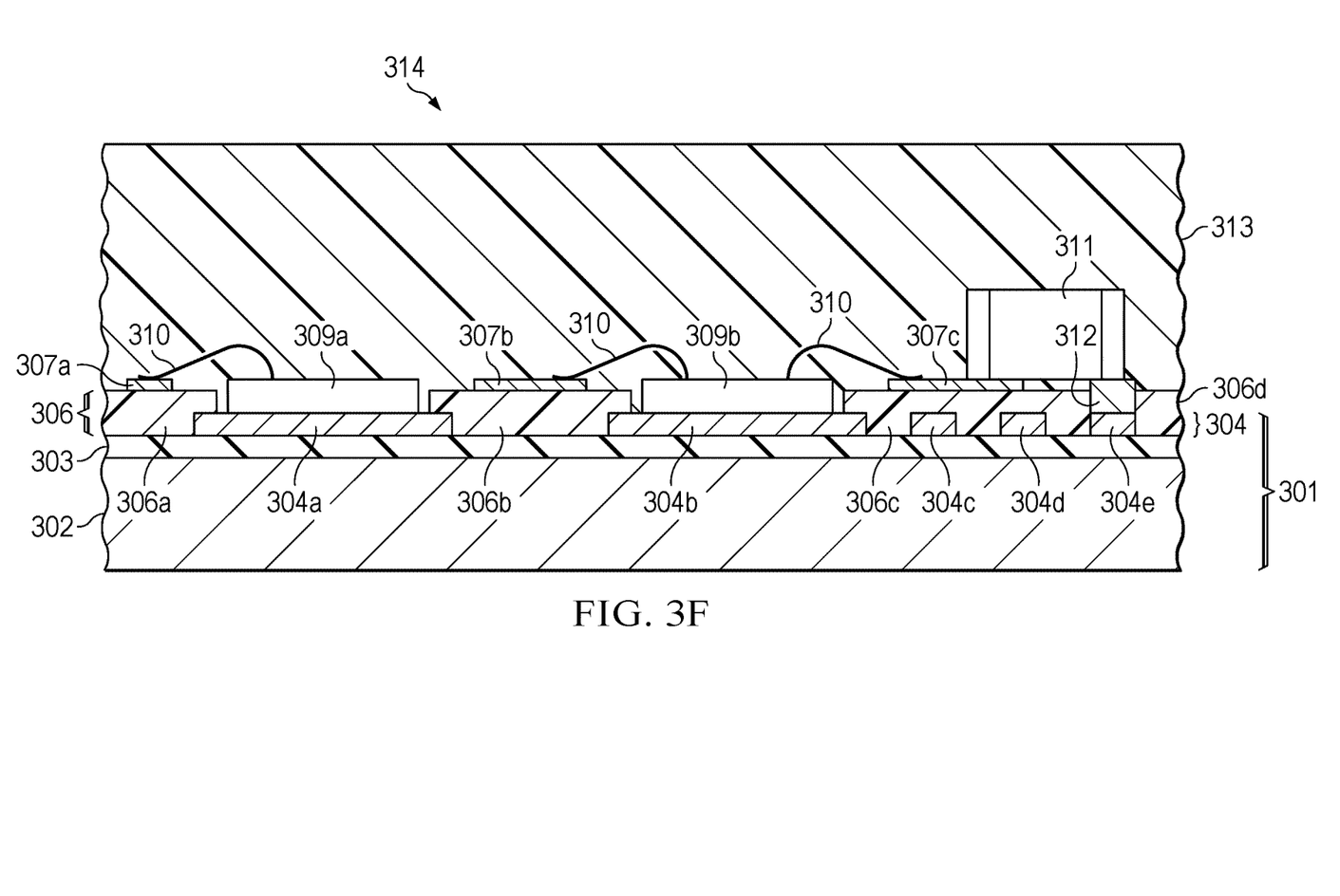

FIG. 3F illustrates a molding compound 313 that has been applied to at least partially cover the TCIL layer 306, copper pads 307 a-c, conductive segments 304 a, 304 b, semiconductor dies 309 a, 309 b, bond wires 310, passive element 311, and conductive material 312. After the mold compound 313 has been applied, the IMS panel 301 and bonded TCIL layer 306 may be severed (i.e., "singulated" or "diced") with a cutting tool, such as a saw or laser. These singulation cuts separate the IMS panel 301 and bonded TCIL layer 306 into separate integrated circuit (IC) packages 314, wherein each IC package includes a singulated IMS panel 301 with attached TCIL layer 306 and at least one semiconductor die or other active or passive device and the mold compound 313 that covers at least part of these structures.

Devices such as IC package 314 that are manufactured in this way have a higher power density than a traditional power module built on an IMS substrate. The TCIL insulation layer 306 can withstand high voltage applications with minimal thermal performance impact. The power density provided by stacking the TCIL layer on top of the IMS panel allows for a reduced package size for high power rated modules. Such devices having a stacked TCIL layer on an IMS substrate may be manufactured using conventional manufacturing equipment.

Although the fabrication and assembly process illustrated in FIGS. 3A-F uses an IMS substrate 301, it will be understood that in other arrangements a DBC substrate may be used in place of IMS substrate 301.

In some arrangements, an IC package 314 has a semiconductor die 309a, 309b that is flip-chip mounted to the device side surface of an IMS or DBC substrate. In another arrangement, a wire bonded semiconductor die is mounted on the device side surface of the IMS or DBC substrate. A die attach material may be used to mount the semiconductor die in a face up orientation with bond pads facing away from the multilayer package substrate.

Figure 4:
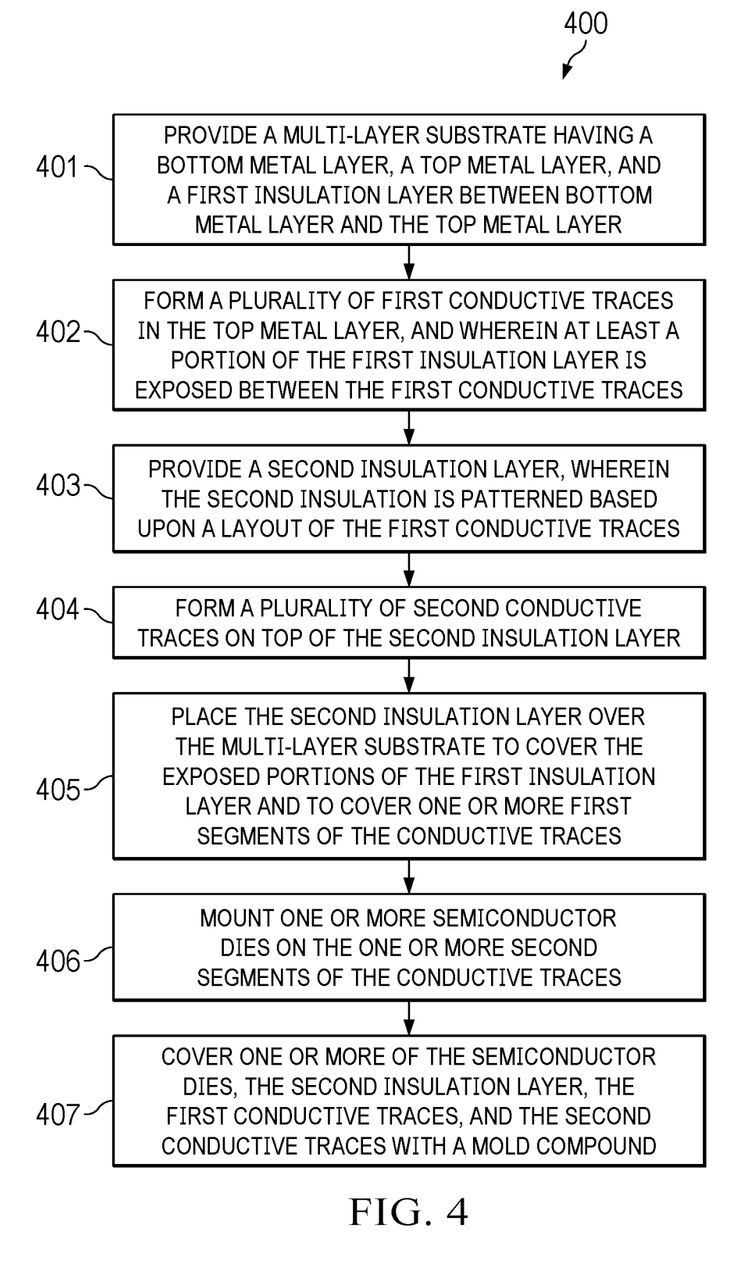
FIG. 4 is a flowchart illustrating an example process for fabrication and assembly of a power module package

FIG. 4 is a flowchart illustrating an example process 400 for fabrication and assembly of a power module package. In step 401, a multi-layer substrate is provided. The multi-layer substrate has a bottom metal layer, a top metal layer, and a first insulation layer between bottom metal layer and the top metal layer. In step 402, a plurality of first conductive traces are formed in the top metal layer. At least a portion of the first insulation layer is exposed between the first conductive traces.

The multi-layer substrate may be DBC substrate in one arrangement. In the DBC multi-layer substrate, the first insulation layer is a ceramic layer. In an alternative arrangement, the multi-layer substrate may be an IMS substrate. In the IMS substrate, the first insulation layer includes an epoxy and a ceramic filler.

In step 403, a second insulation layer is provided. The second insulation is patterned based upon a layout of the first conductive traces. In step 404, a plurality of second conductive traces are formed on top of the second insulation layer. The second insulation layer may be a TCIL layer that includes an epoxy and a ceramic filler. The ceramic filler may include one or more of Aluminum Oxide ($Al_2O_3$), Aluminum Nitride (AlN), Silicon Nitride ($Si_3N_4$), or Boron Nitride (BN). The second insulation layer may be a B-stage insulation layer or have an adhesion layer.

In step 404, the second insulation layer is placed over the multi-layer substrate to cover the exposed portions of the first insulation layer and to cover one or more first segments of the conductive traces. In one arrangement, one or more second segments of the conductive traces are not covered by the second insulation layer. The second insulation layer is adhered to the multi-layer substrate using heat and pressure. The adhering step may include, for example, curing at approximately 160 to 180° C. with <10 kgf/cm2 pressure. The second insulation layer isolates the first conductive traces from the second conductive traces.

In step 405, one or more semiconductor dies are mounted on the one or more second segments of the conductive traces. In other arrangements, one or more bond wires couple the at least one semiconductor dies to one or more of the second conductive traces. In further arrangements, one or more passive devices may be coupled to one or more of the second conductive traces.

In step 406, one or more of the semiconductor dies, the second insulation layer, the first conductive traces, and the second conductive traces are covered with a mold compound.

While various examples of the present disclosure have been described above, it should be understood that they have been presented by way of example only and not limitation. Numerous changes to the disclosed examples can be made in accordance with the disclosure herein without departing from the spirit or scope of the disclosure. Modifications are possible in the described embodiments, and other embodiments are possible, within the scope of the claims. Thus, the breadth and scope of the present invention should not be limited by any of the examples described above. Rather, the scope of the disclosure should be defined in accordance with the following claims and their equivalents.

What is claimed is:
1. A semiconductor package, comprising:
a multi-layer substrate having a bottom metal layer, a top metal layer, and a first insulation layer between the bottom metal layer and the top metal layer, wherein a plurality of first conductive traces are formed in the top metal layer, and wherein at least a portion of the first insulation layer is exposed between the plurality of first conductive traces;
a second insulation layer disposed over the exposed portion of the first insulation layer and over one or more first segments of the plurality of first conductive traces, wherein one or more second segments of the plurality of first conductive traces are partially covered by the second insulation layer;
a plurality of second conductive traces formed on top of the second insulation layer;
one or more semiconductor dies mounted on the one or more second segments of the plurality of first conductive traces; and
mold compound covering the one or more semiconductor dies, the second insulation layer, the plurality of first conductive traces, and the plurality of second conductive traces, wherein the mold compound is in direct contact with the one or more semiconductor dies.

2. The semiconductor package of claim 1, wherein the plurality of first conductive traces form a first circuit pattern, and the plurality of second conductive traces form a second circuit pattern, and wherein the second insulation layer isolates the plurality of first conductive traces from the plurality of second conductive traces.

3. The semiconductor package of claim 1, further comprising:
one or more bond wires coupling the one or more semiconductor dies to one or more of the plurality of second conductive traces.

4. The semiconductor package of claim 1, further comprising:
one or more passive devices coupled to one or more of the plurality of second conductive traces.

5. The semiconductor package of claim 1, wherein the multi-layer substrate is a Direct Bonded Copper (DBC) substrate.

6. The semiconductor package of claim 5, wherein the first insulation layer is a ceramic layer.

7. The semiconductor package of claim 5, wherein the first insulation layer includes one or more of Aluminum Oxide ($Al_2O_3$), Aluminum Nitride (AlN), Silicon Nitride ($Si_3N_4$), and Boron Nitride (BN).

8. The semiconductor package of claim 1, wherein the multi-layer substrate is an Insulated Metal Substrate (IMS).

9. The semiconductor package of claim 8, wherein the first insulation layer includes an epoxy and a ceramic filler.

10. The semiconductor package of claim 9, wherein the ceramic filler includes one or more of Aluminum Oxide ($Al_2O_3$), Aluminum Nitride (AlN), Silicon Nitride ($Si_3N_4$), and Boron Nitride (BN).

11. The semiconductor package of claim 1, wherein the second insulation layer is a Thermally Conductive electrically Isolated Layer (TCIL).

12. The semiconductor package of claim 1, wherein the second insulation layer includes an epoxy and a ceramic filler.

13. The semiconductor package of claim 12, wherein the ceramic filler includes one or more of Aluminum Oxide ($Al_2O_3$), Aluminum Nitride (AlN), Silicon Nitride ($Si_3N_4$), and Boron Nitride (BN).

14. The semiconductor package of claim 1, wherein the second insulation layer is a B-stage insulation layer or wherein the second insulation layer has an adhesion layer.

* * * * *